United States Patent

Webb et al.

[11] Patent Number: 5,413,965
[45] Date of Patent: May 9, 1995

[54] METHOD OF MAKING MICROELECTRONIC DEVICE PACKAGE CONTAINING A LIQUID

[75] Inventors: Brian A. Webb, Chandler; Robert M. Wentworth, Phoenix, both of Ariz.

[73] Assignee: Motorola, Inc., Schaumburg, Ill.

[21] Appl. No.: 119,555

[22] Filed: Sep. 13, 1993

[51] Int. Cl.$^6$ ............................................. H01L 21/56
[52] U.S. Cl. .................................... 437/219; 437/248; 257/712; 257/713; 257/714
[58] Field of Search ................ 257/682, 712, 713, 714; 437/219, 248

[56] References Cited

U.S. PATENT DOCUMENTS

| 4,721,996 | 1/1988 | Tustaniwskyj et al. | 257/714 |
| 4,730,665 | 3/1988 | Cutchaw | 165/80.4 |
| 5,050,036 | 9/1991 | Oudick et al. | 257/714 |
| 5,097,387 | 3/1992 | Griffith | 257/714 |
| 5,126,919 | 6/1992 | Yamamoto et al. | 257/714 |
| 5,187,565 | 2/1993 | Kawai et al. | 257/682 |
| 5,210,440 | 5/1993 | Long | 257/714 |

FOREIGN PATENT DOCUMENTS

| 0164543 | 12/1981 | Japan | 437/219 |
| 007739A | 1/1985 | Japan | 257/682 |
| 037756A | 2/1985 | Japan | 257/714 |
| 096945A | 4/1988 | Japan | 257/714 |
| 3296237 | 12/1991 | Japan | 437/219 |
| 007761A | 10/1988 | WIPO | 257/682 |

OTHER PUBLICATIONS

H. W. Markstein (ed.). "Packaging Ideas," Electronic Packaging & Production, p. 33, Jan. 1993.
Nelson et al., "Thermal Performance of an Integral Immersion Cooled Multichip Module Package," Microelectronics and Computer Technology Corporation Technical Report, 1992.
"IBM Technical Disclosure Bulletin" vol. 20, No. 11B Apr. 1978; Berndlmaier et al.

Primary Examiner—Olik Chaudhuri
Assistant Examiner—Long Pham
Attorney, Agent, or Firm—Joe E. Barbee; Frederick M. Fliegel; Kevin B. Jackson

[57] ABSTRACT

A method for manufacturing a liquid-containing microelectronic device package. The method includes steps of providing (32) a base (16) including a microelectronic device (22) and a seal area disposed peripherally about the base (16), providing (34) a lid (12) and providing (34) a sealant (14) disposed between the base (16) and lid (12). The method also includes steps of immersing (36) the base (16), sealant (14) and lid (12) in a liquid (24) having a temperature above a sealant activation temperature and maintaining (38) the base (16), sealant (14) and lid (12) in the liquid (24) for a time sufficient to allow the liquid (24) to enter between the base (16) and lid (12) and to heat and thereby activate the sealant (14). The method further includes removing (40) the base (16), lid (12) and sealant (14) from the liquid (24) to provide a sealed, liquid-containing microelectronic device package (10).

13 Claims, 1 Drawing Sheet

METHOD OF MAKING MICROELECTRONIC DEVICE PACKAGE CONTAINING A LIQUID

FIELD OF THE INVENTION

This invention relates, in general, to the field of packaging for microelectronic components, and more particularly to a simple liquid-containing package having improved manufacturability.

BACKGROUND OF THE INVENTION

Recent trends in manufacturing of electronic equipment place increased emphasis on reliability and robustness of components employed in such equipment. Effective heat dissipation for power devices pose particular problems for several reasons. Typically, photolithographically defined structures on a top surface of a semiconductor device generate heat while thermally conductive attachment to a heatsink is effected via a bottom surface thereof. Heat thus is coupled from the active device area, through the die and then to the heatsink. As integration levels increase, larger amounts of heat are generated at the top surface and coupled through semiconductor materials having relatively poor thermal conductivity and heat capacity, which can determine the maximum packing density of large scale integrated circuits and/or large-signal or power semiconductor devices. Devices atop the die surface which are not necessarily generating heat themselves are heated by nearby structures, affecting the electronic properties thereof.

One approach to heat removal which has been attempted is to place the semiconductor device in a specially designed liquid-containing device package and lid. A dielectric liquid having benign chemical properties and suitable thermal properties (e.g., vaporization and solidification temperatures) is employed. Prior art packages employ heat exchanging structures and/or bellows to accommodate the liquid-containing cavity and to allow for thermal expansion, etc. These arrangements are not cost-effective for many microelectronic packaging applications. Furthermore, techniques developed to date for evacuating the cavity and back-filling same with dielectric liquids are complex, labor-intensive and poorly suited to volume production. Moreover, approaches employing large cavities and relatively small volumes of liquid therein are not able to maintain the liquid in contact with the chip area absent gravity, in the presence of some accelerations and/or unless the package is in a particular position, which tends to limit the applications for which such packages are well suited.

What are needed are methods and apparatus for providing liquid-filled or liquid-containing semiconductor device packages which also provide improved manufacturability and which are suited to a broad range of applications.

SUMMARY OF THE INVENTION

Briefly stated, there is provided a new and improved microelectronic device package containing a liquid and a method for manufacturing same. The method includes steps of providing a package base including a microelectronic device and also a seal area which is disposed peripherally about the package base, providing a lid disposed over the package base and providing a sealant disposed between the package base and the lid. The method also includes steps of immersing the package base, the sealant and the lid in a liquid having a temperature above an activation temperature of the sealant and maintaining the package base, the sealant and the lid in the liquid for a time sufficient to allow the liquid to enter the package between the package base and the lid and to heat the sealant to activate the sealant. The method further includes removing the package base, the lid and the sealant from the liquid to provide a sealed microelectronic device package containing the liquid.

DETAILED DESCRIPTION OF THE DRAWING

Figure 1:
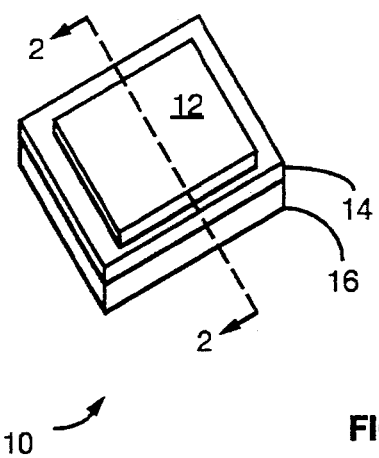
FIG. 1 shows an isometric view of a liquid-containing microelectronic device package in accordance with the present invention.

FIG. 1 is a sketch showing an isometric view of liquid-containing microelectronic device package 10 in accordance with the present invention. Package 10 having lid 12 sealed to base 16 by sealant 14 encloses a microelectronic component (not illustrated in FIG. 1). Package 10 may be any of a number of distinct package types known in the art, such as pin grid array or PGA packages, dual in line or DIP packages formed from separate lids and bases, ball grid array, multichip module substrata, ceramic packages and the like.

Figure 2:
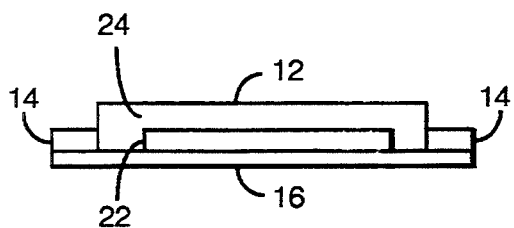
FIG. 2 illustrates a sectional side view, taken along section lines 2—2 of FIG. 1.

FIG. 2 illustrates a sectional side view, taken along section lines 2—2 of FIG. 1. Base 16 having microelectronic device 22 die-bonded thereto also desirably includes external electrical interconnections (not shown) electrically coupled to device 22 via wirebonding, solder bumping, etc., as are known in the art. Bases (e.g., base 16) made from a single layer of alumina or multilayer bases made of insulating materials and having provision for electrical interconnections are available from a variety of vendors such as Kyocera International, San Diego, Calif.

Base 16 is coupled to lid 12 via sealant 14 peripherally disposed about lid 12 and/or base 16, providing liquid-filled cavity 24.

Figure 3:
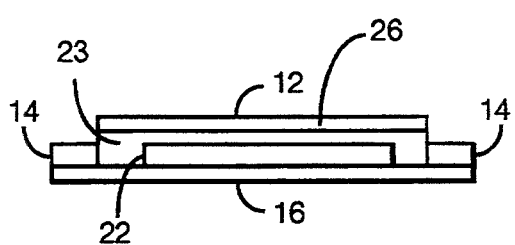
FIG. 3 illustrates a sectional side view of a second embodiment of the present invention.

FIG. 3 illustrates a sectional side view showing a second embodiment of package 10 (FIG. 1). The embodiment of FIG. 3 is similar to the embodiment of FIG. 2, except that portion 26 of the package interior is not liquid filled, i.e., is a bubble above liquid 23 and within lid 12. This arrangement allows portion 26 to absorb stresses occurring when liquid portion 23 expands in response to heat, for example.

Lids (e.g., lid 12, FIGS. 1-3) made from a variety of suitable materials (ceramic, metal including stamped metal lids, plastic and the like) and in shapes and sizes to purchaser specifications, with or without sealant (e.g., B-staged epoxy having a predetermined activation temperature, or solder having a predetermined composition and melting temperature) disposed thereon as desired, are available from a variety of vendors including Kyocera International, San Diego, Calif.

Dielectric liquids suitable for inclusion in packages of the present invention have at least the following five properties: they (i) are chemically benign (nonreactive in the device environment), (ii) have liquid-solid phase change (or "pour") temperature below the expected operating temperature range of the semiconductor device package, (iii) are electrically nonconductive within the expected operating temperature range, (iv) have good thermal conductivity and (v) have gas-liquid phase change temperature within or above the expected operating temperature range.

In some instances, it is desirable to obtain the heat-exchanging benefits provided by allowing some of the liquid within the package to boil, while in other cases, heat conduction and convection of the liquid alone are adequate to provide the desired cooling for the semiconductor device 22. In the former case, it is desirable to provide a region such as 26 (FIG. 3) of controlled size in order to maintain a layer of liquid on the die surface while providing a volume within which vaporized material may condense and to allow for thermal expansion of liquid 23. In the former case, it is also necessary to employ a sealant which undergoes an irreversible change (e.g., chemical reaction) at the activation temperature, rather than a solder, for example. The size or volume of portion 26 needs to be large enough to relieve thermal stresses and small enough that semiconductor device 22 is fluid-covered in normal operation.

Dielectric liquids suitable for use according to the present invention have at least two additional properties: they (vi) do not prevent the sealant from wetting the base and lid and (vii) the vaporization or boiling temperature exceeds an activation (e.g., chemical or phase change) temperature of the sealant. Suitable liquids have boiling points which are usefully greater than 125° C., desirably greater than 100° C. and preferable greater than 50° C. Examples of suitable liquids having pour temperatures and boiling points in useful ranges include the Fluorinert® family of low molecular weight perfluorinated liquids (e.g., $CF_3—[(O—C_2F_4—CF_2)_n—(O—CF_2)_m]—O—CF_3$) available from 3M (St. Paul, Minn.) and the Galden® group of products available from Montefluos (Milan, Italy).

For example, "FC-40" (3M) comprises a mixture of perfluorinated carbon compounds having between five and eighteen carbon atoms per molecule and having a boiling point of about 155° C., a viscosity of circa 2.2 centiStokes at room temperature and a specific gravity of about 1.9, which does not interfere with wetting of metals or ceramics by epoxies such as B-staged epoxy and which has a boiling point above at least some activation temperatures for some such epoxies.

Figure 4:
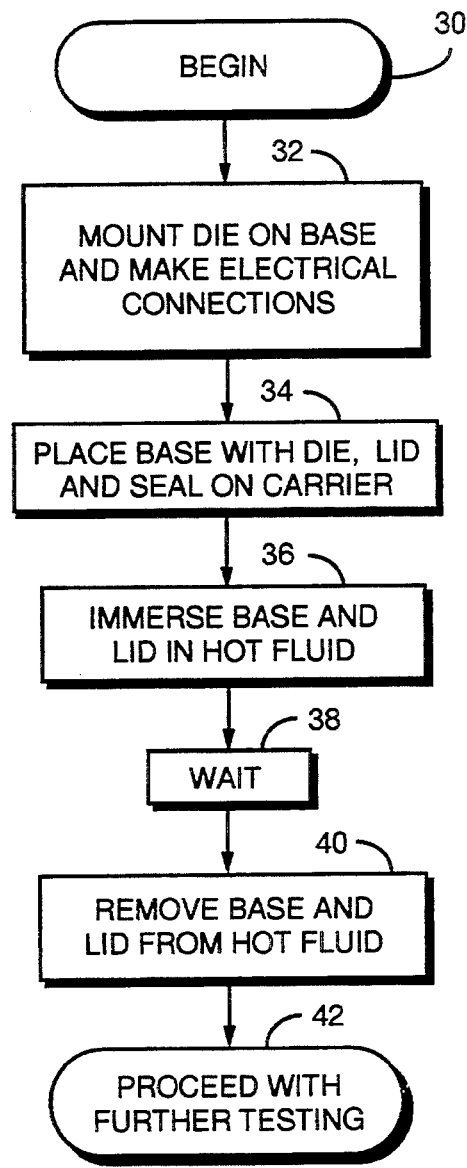
FIG. 4 is a flow chart of a method for making a liquid-containing microelectronic device package in accordance with the present invention.

FIG. 4 is a flow chart of a method for sealing a microelectronic device package containing a liquid in accordance with the present invention. The method for providing liquid-containing packages begins (block 30) and includes die mounting and making electrical interconnections to the die (block 32) in ways compatible with subsequent processing steps. The method includes placing a lid and a base having a microelectronic device physically and electrically coupled thereto together on a carrier (block 34), where the lid and/or base may include sealant disposed around an edge thereof. Alternatively, the sealant may be a preform placed between the lid and base. The carrier including the lid, base and sealant are then placed in a heated bath of the liquid which the package is to contain (block 36). The bath is (pre)heated to a temperature (e.g., a first temperature) at which the sealant undergoes either a phase change (e.g., melting of solder material or thermoplastic material) or a chemical change (e.g., setting of a thermosetting material such as B-staged epoxy), precipitating bonding and sealing of the lid to the base (block 38). The sealant forms a continuous seal about the volume to be sealed. During the sealing process, gas trapped within the package is heated, a majority of the gas is expelled from the area to be sealed (block 38) and the liquid displaces the majority of the gas within the package. The package is removed from the bath, forming a seal between the package base and the lid (block 40). The device in the liquid-containing package is then ready (block 42) for further testing (e.g., to verify seal integrity, electrical performance and the like).

In some cases, it is desirable to largely or completely fill the package interior. By placing lid 12 in an inverted position, placing base 16 atop inverted lid 12 together with sealant 14 and submerging the lid/base combination in the liquid, no opportunity is provided for a bubble of gas to be trapped within package 12. In other cases, it is desirable to provide a bubble such as 26 of FIG. 3. This can be effected by placing base 16 in a noninverted position, placing lid 12 atop base 16 and submerging the combination. The "bowl" of lid 12 traps a controlled amount of gas within the package to provide a sealed package having primarily liquid therein and including a bubble of gas. It will be appreciated that, alternatively, a bowl or dimple may be included in the base and that the lid may present a flat surface.

Thus, an encapsulated microelectronic device and method for manufacturing same are provided, overcoming specific problems and accomplishing certain advantages relative to prior art methods and mechanisms. The process facilitates simultaneous removal of air from packages, addition of heat-exchanging liquids to the package interior and sealing of the package in a simple, cost-effective fashion. By this arrangement, the heat-generating portion of a microelectronic device is placed in direct contact with a liquid which can remove heat therefrom by conduction, convection and/or phase change (evaporation), providing heatsinking capability directly at the portion of the circuit which provides the heat. The package manufacturing process is extremely simple and straightforward and does not require special tooling, complicated processing operations or involve use of chemical compounds known to be hazardous to the operator(s) or to the environment and provides robust packaging for microelectronic devices.

The improvements over known technology are significant and include simplicity of manufacturing, low manufacturing costs, improved fabrication yields and improved product robustness in installation and use.

What is claimed is:

1. A method for manufacturing a microelectronic device package containing a liquid, the method comprising steps of:

providing a base including a microelectronic device and a seal area disposed about a periphery of the base;

placing a lid over the base;

disposing a sealant having an activation temperature between the base and the lid;

immersing the base, the sealant and the lid in a liquid having a temperature above the activation temperature;

maintaining the base, the sealant and the lid in the liquid for a time sufficient to allow the liquid to enter between the base and the lid and to heat the sealant to activate the sealant; and removing the base, the lid and the sealant from the liquid to provide a sealed microelectronic device package containing the liquid.

2. A method as claimed in claim 1, wherein providing a sealant includes a step of providing a sealant disposed in a plane geometry figure, the package base, the package lid and the plane geometry figure comprising the sealant in combination providing a closed cavity containing the liquid.

3. A method as claimed in claim 1, wherein providing a sealant includes a step of providing a heat-activated epoxy.

4. A method as claimed in claim 1, wherein providing a sealant includes a step of providing a low temperature solder.

5. A method as claimed in claim 1, wherein immersing the base, the sealant and the lid in a liquid includes a step of immersing the base, the sealant and the lid in a liquid comprising a mixture of perfluorinated liquids.

6. A method as claimed in claim 1, wherein providing a sealant includes a step of providing a sealant disposed over the seal area of the base.

7. A method as claimed in claim 1, wherein providing a sealant includes a step of providing a sealant disposed over a seal area of the lid.

8. A method as claimed in claim 1, wherein providing a base includes a step of providing a base comprising alumina.

9. A method as claimed in claim 1, wherein maintaining the base, the sealant and the lid in the liquid includes a step of maintaining the base, the sealant and the lid in the liquid for a time sufficient to provide only partial filling of a cavity between the base and the lid with the liquid and including a bubble of gas of a first volume within the cavity.

10. A method for filling a cavity within a package enclosing a semiconductor device, the method comprising steps of:

heating a liquid to a first temperature;

placing a package having a lid and a base, including sealant disposed between the lid and the base, in the liquid to seal the lid to the base; and leaving the package in the liquid until the cavity contains the liquid and the sealant is cured.

11. A method as claimed in claim 10, wherein leaving the package in the liquid includes a step of leaving the package in the liquid until the cavity is filled with the liquid.

12. A method as claimed in claim 10, wherein heating a liquid includes a step of heating a liquid comprising a mixture of perfluorocarbons to a first temperature which is less than a boiling point of the liquid.

13. A method as claimed in claim 10, wherein placing a package includes a step of including a thermally-activated epoxy sealant having an activation temperature between the lid and the base, wherein the activation temperature is less than a boiling point of the liquid.

* * * * *